(12) United States Patent
Lin

(10) Patent No.: US 10,068,822 B2
(45) Date of Patent: Sep. 4, 2018

(54) SEMICONDUCTOR PACKAGE AND METHOD FOR FORMING THE SAME

(71) Applicant: NANYA TECHNOLOGY CORPORATION, Taoyuan (TW)

(72) Inventor: Po-Chun Lin, Changhua County (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 22 days.

(21) Appl. No.: 15/281,100

(22) Filed: Sep. 30, 2016

(65) Prior Publication Data

US 2018/0096907 A1    Apr. 5, 2018

(51) Int. Cl.
| | |
|---|---|
| *H01L 21/48* | (2006.01) |
| *H01L 23/18* | (2006.01) |
| *H01L 21/56* | (2006.01) |
| *H01L 23/31* | (2006.01) |
| *H01L 23/00* | (2006.01) |
| *H01L 25/065* | (2006.01) |
| *H01L 25/00* | (2006.01) |

(52) U.S. Cl.
CPC .......... *H01L 23/18* (2013.01); *H01L 21/4853* (2013.01); *H01L 21/565* (2013.01); *H01L 23/3114* (2013.01); *H01L 24/48* (2013.01); *H01L 25/0657* (2013.01); *H01L 25/50* (2013.01); *H01L 2224/48225* (2013.01); *H01L 2225/0651* (2013.01)

(58) Field of Classification Search
CPC ..... H01L 23/18; H01L 23/3114; H01L 25/50; H01L 25/0657; H01L 21/4853; H01L 21/565; H01L 24/48
See application file for complete search history.

(56) References Cited

U.S. PATENT DOCUMENTS

| | | | | |
|---|---|---|---|---|
| 2003/0155636 | A1* | 8/2003 | Cobbley | ............... H01L 21/565 257/675 |
| 2011/0018115 | A1* | 1/2011 | Takahashi | ............. H01L 21/561 257/686 |

FOREIGN PATENT DOCUMENTS

| | | |
|---|---|---|
| TW | 200620592 A | 6/2006 |
| TW | 201125101 A1 | 7/2011 |

\* cited by examiner

*Primary Examiner* — (Vikki) Hoa B Trinh
(74) *Attorney, Agent, or Firm* — CKC & Partners Co., Ltd.

(57) ABSTRACT

A method for forming semiconductor packages includes disposing at least one flow hindering supporter onto a substrate, in which the substrate has at least one active region and at least one gap region surrounded the active region, the flow hindering supporter is located on the gap region; subsequently, disposing at least one die structure onto the active region of the substrate respectively; and then injecting a molding compound flowed into the gap region, to mold the flow hindering supporter and the die structure with the molding compound.

16 Claims, 8 Drawing Sheets

US 10,068,822 B2

SEMICONDUCTOR PACKAGE AND METHOD FOR FORMING THE SAME

BACKGROUND

Field of Invention

The present disclosure relates to a method for fabricating semiconductor packages. More particularly, the present disclosure relates to fabricate the semiconductor packages through molding compound.

Description of Related Art

With semiconductor packaging techniques, the semiconductor product could be more compactly integrated, and provide a better performance with greater miniaturization. Consequently, methods for forming semiconductor packages, such as wire bonding, flip chip, and wafer level packaging, are developed to fulfill various demands. Some of the methods for forming semiconductor packages may adopt molding compound to mold the semiconductor packages, such that one or more semiconductor devices molded within the semiconductor packages can be protected by the molding compound. However, the fabrication of the molding compound may generate defects on some of the semiconductor packages. For example, a molding compound may be injected to cover the semiconductor devices, but some vacant spaces may be created within the molding compound. As a consequence, the semiconductor packages with defects formed in it cannot be used, so that the defects of the molding compound may increase the cost of fabricating the semiconductor packages. Therefore, the fabrication of the semiconductor packages and the available structures of semiconductor packages, as described above, apparently exists inconvenience and defects, which needs further improvement. To deal with the aforesaid problem, practitioners of ordinary skill in the art have striven to attain a solution, and the problem still lacks a suitable solution to be developed. Therefore, to deal with the aforesaid problem effectively is an important subject of research and development, and also a desired improvement in the art.

SUMMARY

The method for forming semiconductor packages provided in the present disclosure adopts flow hindering supporters disposed onto a substrate for hindering the flow and varying flow field of a molding compound, so that the molding compound may fully cover the substrate, semiconductor devices disposed on the substrate, and the flow hindering supporters more easily.

The present disclosure provides a method for forming semiconductor packages. The method includes disposing flow hindering supporters onto a substrate, in which the substrate has active regions and at least one gap region surrounded the active regions, the flow hindering supporters are located on the gap region; subsequently, disposing die structures onto the active regions of the substrate respectively; and then injecting a molding compound flowed into the gap region and above the die structures, to mold the flow hindering supporters and the die structures with the molding compound.

The present disclosure provides a semiconductor package. The semiconductor package includes a substrate, a die structure, supporters and a molding compound. The substrate has corner regions proximal to the border of the substrate and a central region. The die structure is disposed on the central region of the substrate. The supporters are disposed on the corner regions. The molding compound may cover the substrate, the die structure, and the supporters.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
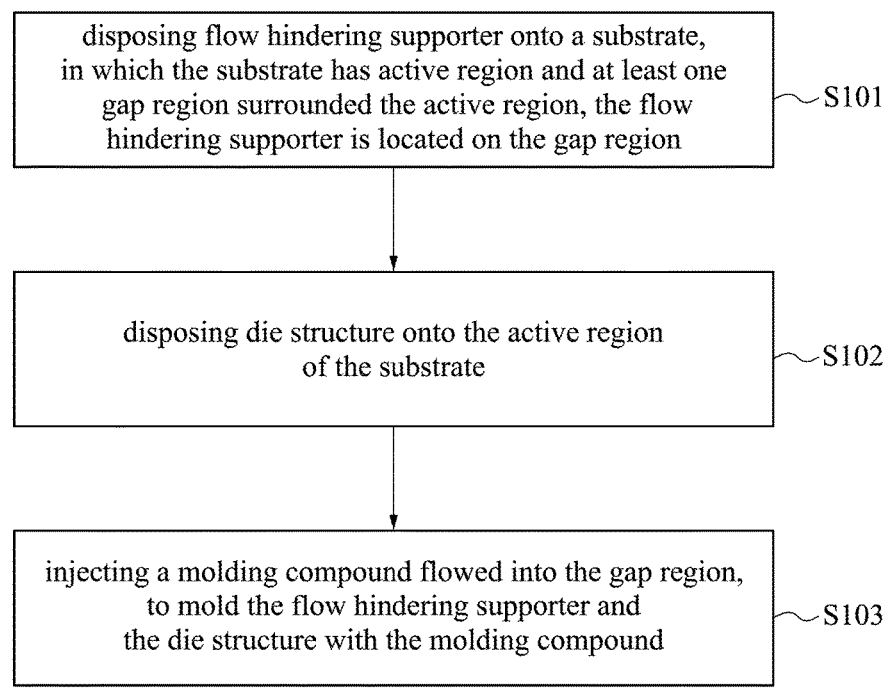
FIG. 1 is a flowchart illustrating a method for forming semiconductor packages according to an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

It will be understood that when an element is referred to as being "on", "over" another element, it can be directly on the other element or intervening elements may be present therebetween. In contrast, when an element is referred to as being "directly on" another element, there are no intervening elements present.

Reference is made to FIG. 1. FIG. 1 illustrates a flowchart of a method for forming semiconductor packages according to an embodiment of the present disclosure. As shown in FIG. 1, the method begins with step S101 in which flow hindering supporters are disposed onto a substrate. The substrate has active regions and at least one gap region surrounded the active regions. For example, the active regions 212 and the gap region 214 shown in FIG. 2. In some embodiments, the flow hindering supporters are disposed onto the gap region.

Subsequently, the method continues with step S102 in which die structures are disposed onto the active regions of the substrates respectively (referring to FIG. 4). In some embodiments, each of the die structures can be a single die. In other embodiments, each of the die structures can be a die stack, including two or more dies. In some embodiments, one or more top die can be bonded to a bottom die to form a die structure, and then the bottom die of the die structure may be bonded to an active region of the substrate. In some embodiments, the top surface of each of the flow hindering supporters may be substantially equal or higher than the top surface of each of the die structures relative to the substrate.

It should be noted that the arrangement of the flow hindering supporters and the height of the flow hindering supporters relative to the substrate, described herein, are only an exemplary, and not intended to limit the present disclosure. For example, a flow hindering supporter can be disposed between two adjacent die structures only in a first channel. That is, the arrangement and the height of the flow hindering supporters can be adjust to fulfill the actual demand while the flow hindering supporters are enable to hinder and partially vary the flow direction of a molding compound, which would be described later.

Subsequently, the method continues with step S103 in which a molding compound is injected to flow into the gap region, and then the molding compound can be cured and mold the flow hindering supporters and the die structures (referring to FIG. 5A, 5B). In some embodiments, the molding compound can be injected above the die structure. In some embodiments, a surface of the die structure can be exposed while the injecting molding compound surrounds the die structure. In some embodiments, the molding compound being injected may be flowed in spreading directions while the injected molding compound is hindered by the flow hindering supporters and the die structures. In some embodiments, the molding compound may be cured after the molding compound become static. In other embodiments, the molding compound can be gradually cured while the molding compound being injected, so that the semiconductor packages can be fabricated within a shorter time compared to curing after the injection of the molding compound.

Owing to the method provided in the present disclosure adopts the flow hindering supporters disposed on the gap region to partially hinder the flow of the injected molding compound, part of the injected molding compound would be guided to flow onto the die structures through the flow hindering supporters. More specifically, while the flow hindering supporters disposed on the gap region, especially on the first channels or intersection area of the first channels and second channels, can apply resistance against the flow of the molding compound, such that the force of the flow hindering supporters exerted on the molding compound can change the flow direction of part of the injected molding compound, and the molding compound would flow above the die structures more easily. As a consequence, the flow hindering supporters may help the spaces above the die structures being fully occupied by the molding compound, to prevent the semiconductor packages from forming any molding defect, especially the molding defects formed above the die structures. Furthermore, owing to the method employed the flow hindering supporters can decrease the generating of the molding defects within semiconductor packages, the method can increase the yield rate of the semiconductor packages, and save the cost of the fabrication.

In addition, owing to the flow hindering supporters can moderate the flow of the injected molding compound, the momentum of the injected molding compound may also be decreased. Furthermore, in some cases, the viscosity of the molding compound would be increased while the molding compound gradually curing during the injection, such that the momentum would also be decreased. As a consequence, the flow hindering supporters can prevent the die structures bonded to the substrate from detached, in which the yield rate of the semiconductor packages can be increased.

Figure 2:
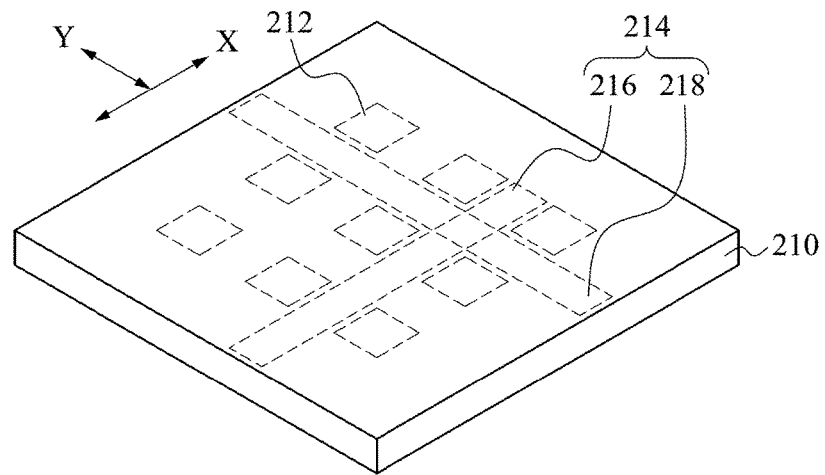
FIG. 2 to FIG. 7 are simplified fragmentary respective views of semiconductor packages at various stages according to an embodiment of the present disclosure.

Reference is then made to FIGS. 2-7. FIG. 2 to FIG. 7 illustrate simplified fragmentary cross-sectional views of a semiconductor package 200 at various stages according to some embodiments of the present disclosure. As shown in FIG. 2, a substrate 210 is provided. The substrate 210 may have active regions 212 and at least one gap region 214 surrounded the active regions 212. More specifically, areas of the substrate 210 configured to be bonded with die structures 230 may be regarded as the active regions 212, and the rest part of the substrate 210 may be assigned as the gap region 214. In some embodiments, the gap region 214 may have first channels 216. The first channels 216 are extended along a first direction X parallel the substrate 210. In other embodiments, the gap region 214 may further have second channels 218. The second channels 218 are extended along a second direction Y differed from the first direction X and also parallel the substrate 210. The second channels 218 are intersected with the first channels 216 respectively.

Figure 3:
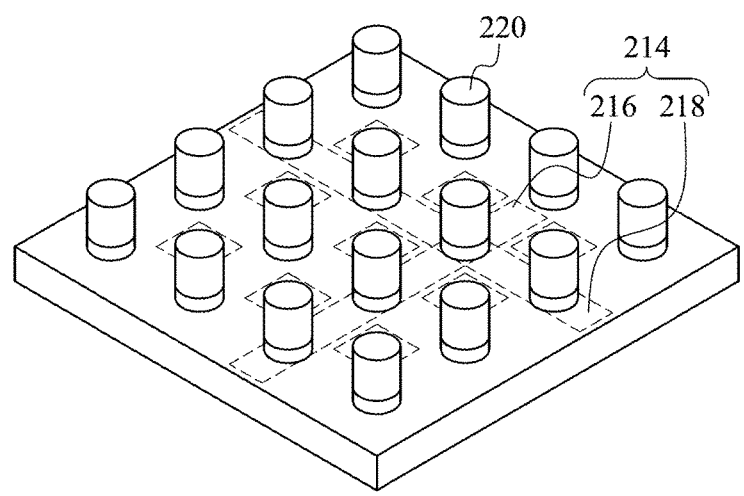

Reference is then made to FIG. 3, which may correspond to step S101. As shown in FIG. 3, flow hindering supporters 220 are bonded onto the substrate 210. In some embodiments, the flow hindering supporters 220 can be bonded within the first channels 216. In other words, the first channels 216 may be disposed with at least one flow hindering supporters 220, to increase flow resistance of the first channel 216. In other embodiments, the flow hindering supporters 220 may be bonded within the intersected areas of the first channels 216 and the second channels 218.

Figure 4:
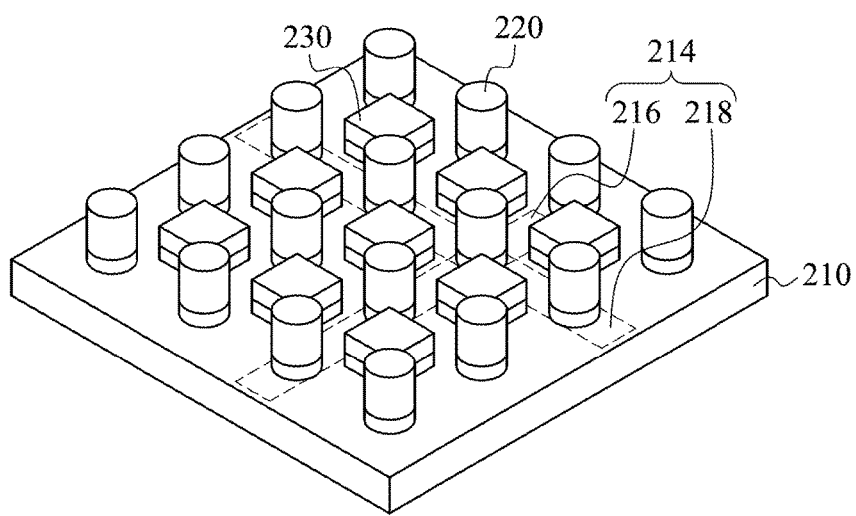

Reference is then made to FIG. 4, which may correspond to step S102. As shown in FIG. 4, die structures 230 can be bonded to the active regions 212 of the substrates 210. In some embodiments, the die structure 230 can be a single die. In other embodiments, the die structure 230 can be a die stack, including two or more dies (referring to FIG. 5B). In some embodiments, the top surface of the flow hindering supporter 220 may be substantially equal or higher than the top surface of the die structure 230 relative to the substrate 210.

Figure 5A:
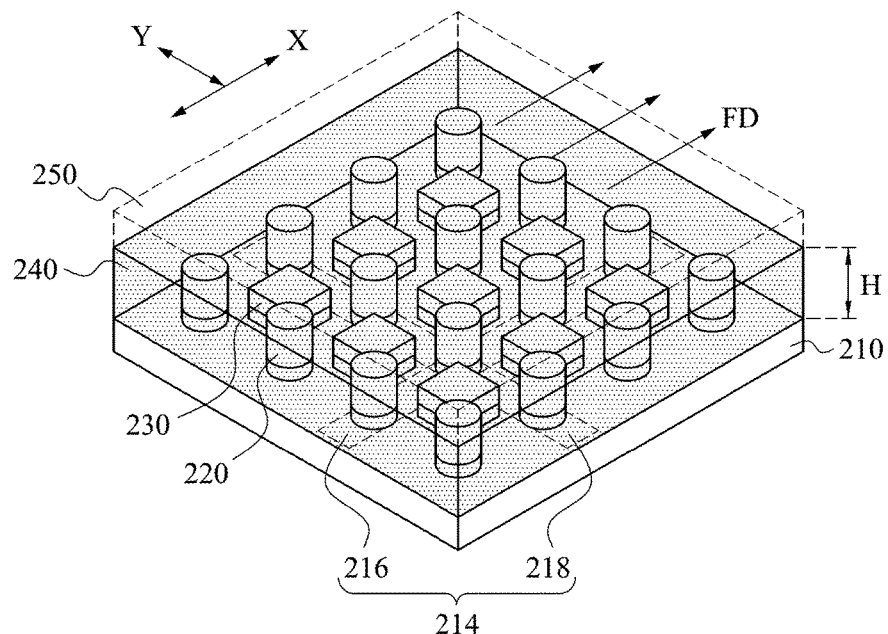
Figure 5B:
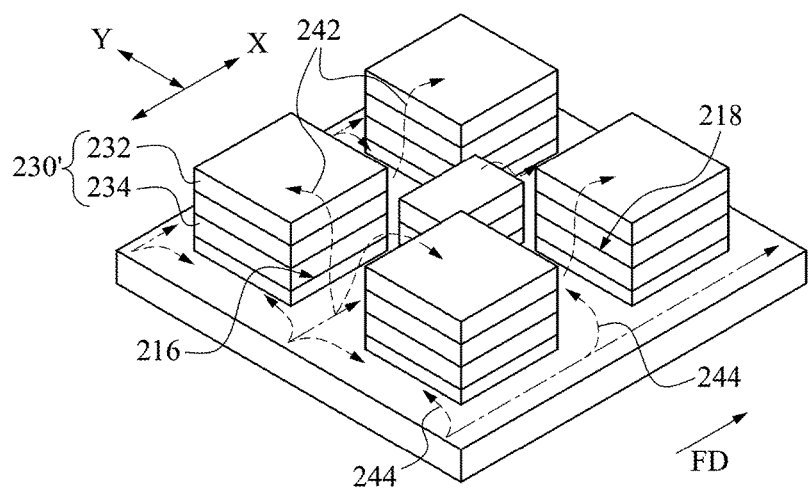

Reference is then made to FIG. 5A and FIG. 5B, which may correspond to steps S103. As shown in FIG. 5A, a molding compound 240 can be injected and flow along a flow direction FD above the substrate 210. In some embodiments, the flow direction FD can be substantially parallel to the first direction X. Subsequently, the molding compound 240 may flow into the gap region 214 and spaces above the die structures 230, and then the molding compound 240 can be cured to mold the flow hindering supporters 220 and the die structures 230. In some embodiments, the molding compound 240 can be gradually cured while the molding compound 240 is still flowing.

In some embodiments, a plate 250, shown as dotted lines above the molding compound 240, can be installed above the substrate 210 before the molding compound 240 is injected, such that the flow hindering supporters 220 and the die structures 230 are sandwiched between the plate 250 and the substrate 210. In some embodiments, a surface of the plate 250 faced toward the substrate 210 may be a flat surface parallel to the substrate 210. The plate 250 and the substrate 210 can confine the flow of the molding compound, to ensure the gap regions 214 and spaces between the die structures 230 and the plate 250 being filled by the molding compound 240. In some embodiments, the distance H between the plate 250 and the substrate 210 can be adjusted to fulfill the actual demand, for example, adjusting for the height of the semiconductor packages. Furthermore, the distance H can further adopt for controlling the flow rate of the molding compound 240, so as to deal with the curing time and the viscosity of the gradually curing molding compound. For example, the flow rate of the molding compound 240 can be adjusted to avoid the molding compound 240 being cured before the die structures 230 are fully covered. For example, the smaller the distance H is, the faster the flow rate of the molding compound 240 can be.

Referring to FIG. 5B, in which an enlarge view of an area cropped from FIG. 5A are illustrated, and one of the flow hindering supporters 220 is drawn herein to represent all the other flow hindering supporters 220. As shown in FIG. 5B, in other embodiments, a top die 232 can be bonded to a bottom die 234 to form a die structure 230'. Then, the die structure 230' can be bonded to the active region 212 of the substrate 210 through the bottom die 234. In some embodiments, the border of the top die 232 is located within the border of the bottom die 234.

In some embodiments, the molding compound 240 may flow above the substrate 210 along the flow direction FD. When the flow of the molding compound 240 propagates between the flow hindering supporter 220 and the die structures 230', such that the flow hindering supporter 220 and the die structures 230' may hinder or divide the flow of the molding compound 240 for varying or re-guiding the propagating direction of the flow. For example, the molding compound 240 flowed along the first channels 216 can be divided by the flow hindering supporter 220. Parts of the molding compound 240 may flow along fringes of the die structure 230, and be lifted to spaces above the die structures 230', such as flow fields 242. Parts of molding compound 240 may be guided to flow into the second channels 218, such as flow fields 244. That is, the flow hindering supporter 220 may increase the flow resistance of the first channel 216, so as to impel or guide the molding compound 240 flowed into the spaces over the die structures 230 and the second channels 218.

Furthermore, the flow hindering supporter 220 increasing the flow resistance may further increase the velocity of the flow fields 242 of the molding compound 240, such that the momentum of the molding compound 240 may also be increased. As a consequence, the flow hindering supporter 220 can prevent the die structures 230' bonded to the substrate 210 from detached, so as to increased the defect free rate and the yield rate of the semiconductor packages.

Figure 6:
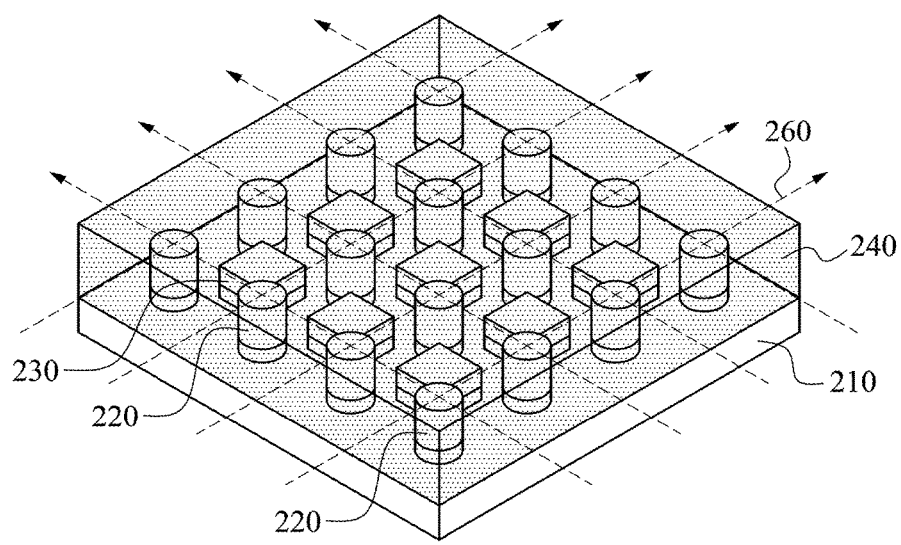

Reference is then made to FIG. 6. As shown in FIG. 6, scribe lines may be predetermined on the molding compound 240 or the substrate 210. The die structures 230 can be singulated through the scribe lines 260, to form semiconductor packages 200 (referring to FIG. 7). In some embodiments, a vertical projection of one of the scribe lines 260 on the substrate 210 may overlap at least one of the flow hindering supporters 220. In other embodiments, the vertical projection of one of the scribe lines 260 on the substrate 210 may trespass an area without the flow hindering supporters 220. Therefore, the semiconductor packages 200 can be formed and avoid cutting through the die structure 230.

Figure 7:
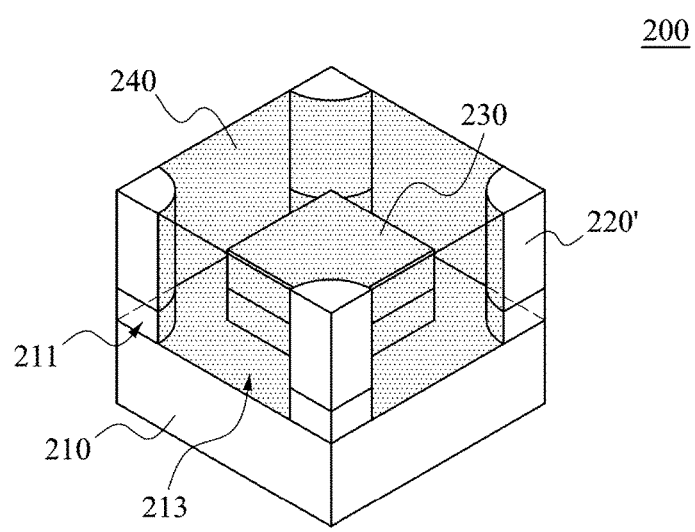

Reference is then made to FIG. 7, in which one of the singulated semiconductor packages 200 is illustrated. As shown in FIG. 7, in some embodiments, the semiconductor package 200 may include a substrate 210, a die structure 230, flow hindering supporters 220' and a molding compound 240. The substrate 210 may be partitioned into corner regions 211 proximal to the border of the substrate 210 and a central region 213 among the corner regions 211. The die structure 230 can be disposed on the central region 213 of the substrate 210. The flow hindering supporters 220' are disposed on the corner regions 211. The molding compound 240 may cover the substrate 210, the die structure 230, and the flow hindering supporters 220'. In addition, one or more flow hindering supporters 220 may locate on the extreme edge of the corner region 211, or further be exposed on the side wall of the semiconductor package 200. In some embodiments, the flow hindering supporter 220' embedded inside the semiconductor package 200 may be a partially-divided part of one of the flow hindering supporters 220 shown in FIG. 6.

In some embodiments, the material of the flow hindering supporters 220' can be selected among the materials fabricating the die structure 230, such as silicon, silicon compound, III-V compound or other suitable materials. Therefore, the flow hindering supporters 220' may provide greater Young's modulus or hardness to the substrate 210 compared to the molding compound 240, such that the flow hindering supporters 220' can assist the semiconductor package 300 for resisting force-induced warpage, especially on the corner region 211. In some embodiments, the CTE (coefficient of thermal expansion) of the flow hindering supporters 220' may be more closer to CTE of the die structures 230, to avoid the warpage of the semiconductor package 200 induced by an unbalance force generated from inhomogeneous expansion.

Figure 8A:
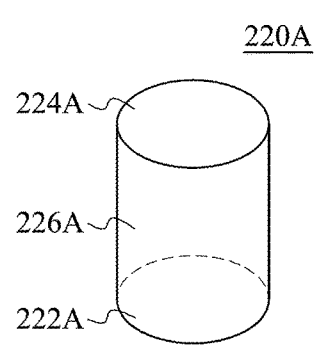
FIG. 8A to FIG. 8F are respective views of a flow hindering supporter according to various embodiments of the present disclosure.

FIG. 8A to FIG. 8F respectively illustrate respective views of a flow hindering supporter 220A~220F according to various embodiments of the present disclosure. As shown in FIG. 8A, in some embodiments, the flow hindering supporter 220A may have a first end 222A and a second end 224A opposite the first end 222A. The first end 222A is configured to locate proximal to the substrate 210, and the second end 224A is configured to locate distal to the substrate 210. In some embodiments, the area of an end surface of the first end 222A may be substantially equal to the area of an end surface of the second end 224A. In some embodiments, the surfaces 226A of the flow hindering supporters 220A connected between the first end 222A and the second end 224A can be curved planes, to slightly moderate the flow resistance to the flowing molding compound 240.

Figure 8B:
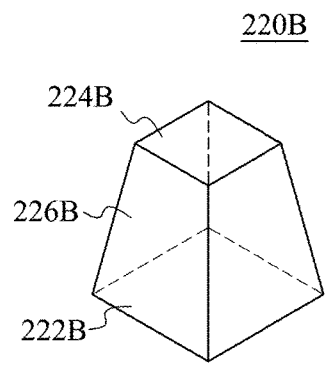
Figure 8C:
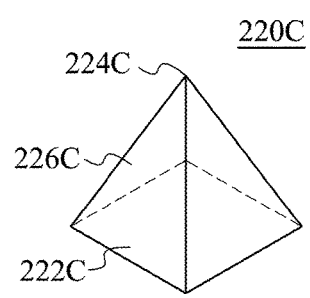

As shown in FIG. 8B, in some embodiments, the area of an end surface of the first end 222B may be greater than the area of an end surface of the second end 224B. In some embodiments, the cross-sectional areas of the flow hindering supporter 220B may be gradually increased from the first end 222B to the second end 224B. In some embodiments, the surfaces 226B of the flow hindering supporters 220B connected between the first end 222B and the second end 224B can be flat planes, to provide stronger force resisting against or divided the flowing molding compound 240. As shown in FIG. 8C, in some embodiments, the second end 224C can also be shrank to a pointed end. Owing to the first end 222B, 222C proximal to the substrate 210 may generate a greater flow resistance compared to the second end 224B, 224C, the flow fields of the molding compound 240 are prone to be guided or forced to flow onto space above the die structure 230.

Figure 8D:
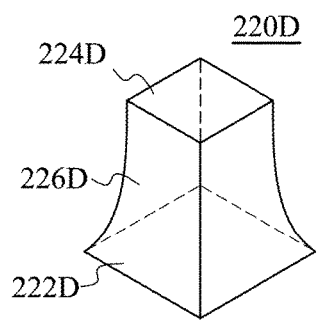

As shown in FIG. 8D, in some embodiments, the surface 226D of the flow hindering supporters 220D connected between the first end 222D and the second end 224D are curved planes. Therefore, the flow field of the molding compound 240 guided by the flow hindering supporters 220D can be varied more smoothly, to prevent generating turbulence from the flow fields collided with the surface 226D of the flow hindering supporters 220D.

Figure 8E:
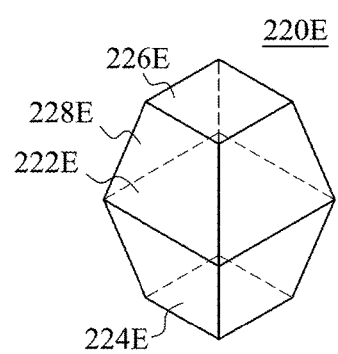

As shown in FIG. 8E, in some embodiments, the flow hindering supporters 220E may have a middle part 222E and end parts 224E, 226E sandwiched the middle part 222E. In some embodiment, the middle part 222E may have a greater cross-sectional area compared to the end parts 224E, 226E. One of the end parts 224E, 226E of the flow hindering supporter 220E can be bonded to the substrate 210, for example, the end part 224E. In some embodiments, the area of an end surface of the end part 224E configured to be proximal to the substrate 210 may be greater than the area of an end surface of the end part 226E configured to be distal to the substrate 210.

Figure 8F:
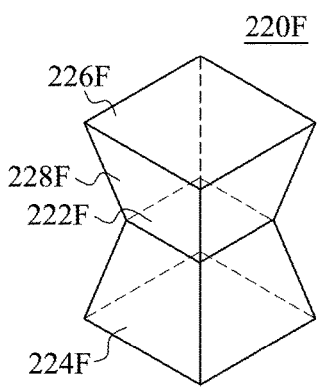

As shown in FIG. 8F, in some embodiments, the middle part 222F of the flow hindering supporters 220F may have a smaller cross-sectional area compared to the end parts 224F, 226F of the flow hindering supporters 220F. One of the end parts 224F, 226F of the flow hindering supporter 220F can be bonded to the substrate 210, for example, the end part 224F. In some embodiments, the middle part 222F can be closer to the end part 224F instead of the end part 226F.

Figure 9:
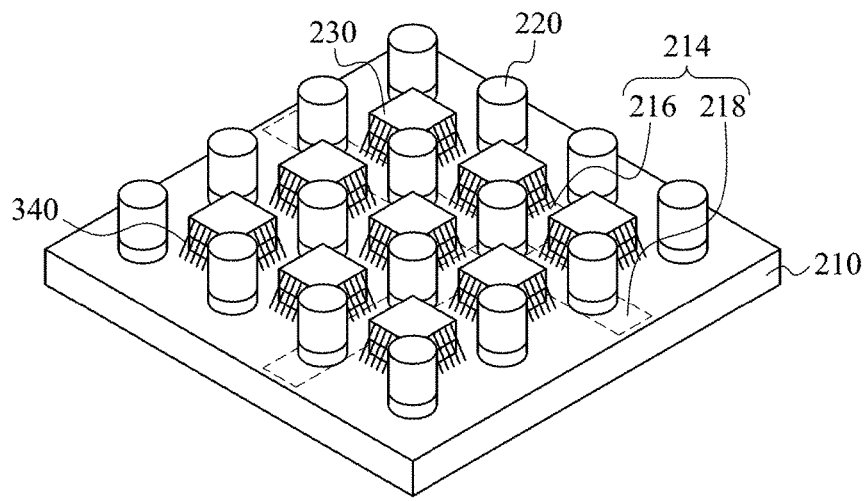
FIG. 9 is a simplified fragmentary respective view of semiconductor packages at one of stages according to another embodiment of the present disclosure.

FIG. 9 illustrates a simplified fragmentary respective view of semiconductor packages at one of stages according to another embodiment of the present disclosure. As shown in FIG. 9, metal wires 340 can be bonded to the top surface of the die structures 230 and the substrate 210 before the molding compound 240 being injected, so that the metal wires 340 can enhance the bonding strength between the die structure 230 and the substrate 210.

Figure 10A:
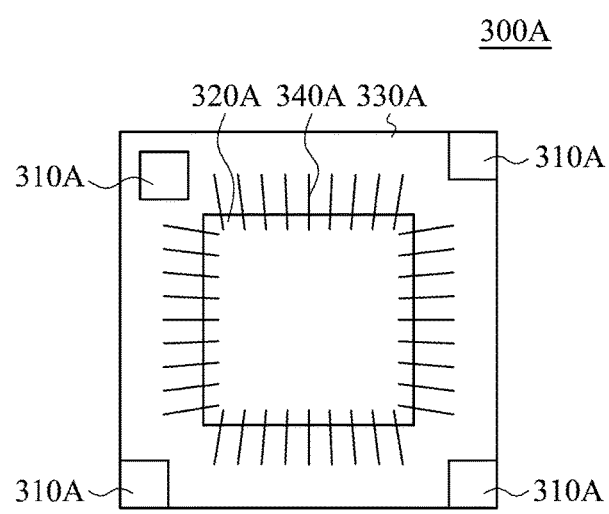
FIG. 10A to FIG. 10C are simplified top views of a semiconductor package according to various embodiments of the present disclosure.
Figure 10B:
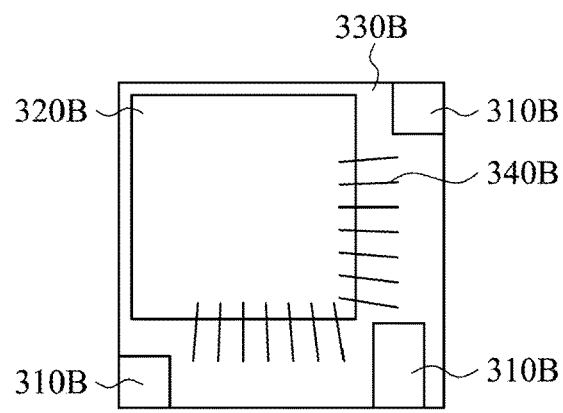
Figure 10C:
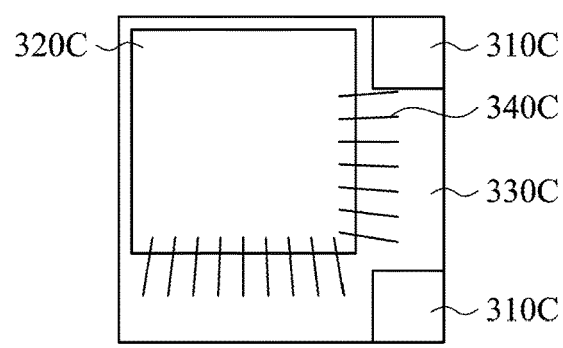

FIG. 10A to FIG. 10C respectively illustrate simplified top views of semiconductor packages 300A~300C according to various embodiments of the present disclosure. As shown in FIG. 10A, each corner of the semiconductor package 300A may be disposed with one of the flow hindering supporters 310A. The flow hindering supporters 310A can be non-overlapping with the die structure 320A. In some embodiments, the flow hindering supporter 310A can be exposed on a surface of the molding compound 330A, for example, the flow hindering supporters 310A on the upper right corner, the lower right corner, and the lower left corner. In some embodiments, the flow hindering supporter 310A can be fully embedded inside the molding compound 330, for example, the flow hindering supporter 310A on the upper left corner. The flow hindering supporter 310A disposed on the corner of the semiconductor package 300A without the die structure 320A can help the semiconductor package 300A resist warpage.

In some embodiments, the semiconductor package 300A may further include metal wires 340A bonded between the die structure 320A and the substrate (not shown), and embedded inside the molding compound 330A, so as to enhance bonding of the die structure 320A to the semiconductor package 300A.

As shown in FIG. 10B, in some embodiments, the die structure 320B may occupy at least one corner (e.g., the upper left corner) of the semiconductor package 300B. Therefore, the corner being occupied can be fabricated without the flow hindering supporter 310B. As shown in FIG. 10O, in some embodiments, the die structure 320C may occupy two corners (e.g., the upper left and lower left corners) of the semiconductor package 300C. Therefore, the corners being occupied can also be fabricated without the flow hindering supporter 310C.

Summarized from the above, owing to the flow hindering supporters disposed on the substrate can hinder the flow and vary flow field of the molding compound, so that the molding compound may fully cover the substrate, semiconductor device disposed on the substrate, and the flow hindering supporters more easily. Therefore, the method may increase the yield rate of fabricating the semiconductor packages.

In addition, owing to the supporters can enhance the corner of the semiconductor package, so that the force-induced warpage of the semiconductor package can be avoided or prevented.

Although some embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, fabricate, composition of matter, means, methods, and steps described in the specification. As one of ordinary skill in the art will readily appreciate from the disclosure of the present disclosure, processes, machines, fabricate, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, fabricate, compositions of matter, means, methods, or steps.

What is claimed is:

1. A method for forming semiconductors package comprising:
    disposing at least one flow hindering supporter onto a substrate, wherein the substrate has at least one active region and at least one gap region surrounded the active region, the flow hindering supporter is located on the gap region, wherein the flow hindering supporter has a first end proximal to the substrate and a second end distal to the substrate, and an area of an end surface of the first end is substantially greater than or equal to and area of an end surface of the second end;
    disposing at least one die structure onto at least one active region of the substrate;
    injecting a molding compound flowed into the gap region, to mold the flow hindering supporters and the die structures with the molding compound; and
    dividing the at least one flow hindering supporter while singulating the at least one die structure.

2. The method of claim 1, wherein the gap region has at least one first channel extended along a first direction parallel the substrate, and disposing the at least one flow hindering supporter comprises disposing the flow hindering supporter on the first channel, wherein the injecting of the molding compound comprises injecting the molding compound along the first direction.

3. The method of claim 2, wherein the gap region further has at least one second channel extended along a second direction differed from the first direction and parallel the substrate, and the second channel is intersected with the first channel, wherein disposing the at least one flow hindering supporter comprises disposing the flow hindering supporter onto intersected areas of the first channel and the second channel.

4. The method of claim 1, wherein in the flow hindering supporter, cross-sectional area of the flow hindering supporter is gradually increased from the second end to the first end.

5. The method of claim 1, wherein in the flow hindering supporter, surfaces connected between the first end and the second end are flat planes.

6. The method of claim 1, wherein in the flow hindering supporter, surfaces connected between the first end and the second end are curved planes.

7. The method of claim 1, wherein the flow hindering supporter has a middle part and end parts sandwiched the middle part, and the middle part has a smaller cross-sectional area compared to the end parts, wherein the disposing the flow hindering supporter comprising bonding one of the end parts of the flow hindering supporter onto the substrate.

8. The method of claim 1, further comprising curing the molding compound gradually while the injecting of the molding compound.

9. The method of claim 1, wherein the disposing of the die structure comprises:
bonding at least one top die to bottom die to form the die structure; and
bonding the bottom die onto the active region of the substrate.

10. A method for forming semiconductors package comprising:
disposing at least one flow hindering supporter onto a substrate, wherein the substrate has at least one active region and at least one gap region surrounded the active region, the flow hindering supporter is located on the gap region;
disposing at least one die structure onto at least one active region of the substrate;
injecting a molding compound flowed into the gap region, to mold the flow hindering supporters and the die structures with the molding compound;
bonding at least one metal wire from a top surface of the die structure to the substrate before injecting the molding compound; and
dividing the at least one flow hindering supporter while singulating the at least one structure.

11. The method of claim 1, further comprising singulating the die structure along predetermined scribe lines parallel the substrate, wherein a vertical projection of at least one of the scribe lines on the substrate overlaps at least one flow hindering supporter.

12. The method of claim 1, further comprising installing a flat surface above the flow hindering supporter and the die structure before the injecting of the molding compound.

13. A semiconductor package comprising:
a substrate having a plurality of corner regions proximal to a border of the substrate and a central region which is out of corner region;
a die structure disposed on the central region of the substrate;
a plurality of supporters disposed on the corner regions respectively, either one of the supporters is spaced from another one of the supporters, each of the supporters has a middle part and end parts sandwiched the middle part, wherein a cross-sectional area of each of the supporters is gradually reduced from the end parts to the middle part; and
a molding compound covered at least a part of the substrate and supporter, and surrounded at least a part of the die structure.

14. The semiconductor package of claim 13, wherein at least one surface of the molding compound exposes a part of the supporters.

15. The semiconductor package of claim 13, wherein each of the supporters has a first end proximal to the substrate and a second end distal to the substrate, wherein an area of an end surface of the first end is substantially greater than an area of an end surface of the second end.

16. The semiconductor package of claim 13, further comprises at least one metal wire connected between a top surface of the die structure and an area of the central region without the die structure.

* * * * *